(12) United States Patent
Han et al.

(10) Patent No.: US 11,925,043 B2
(45) Date of Patent: Mar. 5, 2024

(54) QUANTUM DOT LIGHT-EMITTING DEVICE AND ELECTRONIC DEVICE

(71) Applicant: SAMSUNG ELECTRONICS CO., LTD, Suwon-si (KR)

(72) Inventors: Moon Gyu Han, Suwon-si (KR); Heejae Lee, Seongnam-si (KR); Eun Joo Jang, Suwon-si (KR); Tae Ho Kim, Seongnam-si (KR); Kun Su Park, Seongnam-si (KR); Won Sik Yoon, Seoul (KR); Hyo Sook Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 35 days.

(21) Appl. No.: 17/072,436

(22) Filed: Oct. 16, 2020

(65) Prior Publication Data

US 2021/0119161 A1   Apr. 22, 2021

(30) Foreign Application Priority Data

Oct. 18, 2019   (KR) .......................... 10-2019-0129887
Oct. 14, 2020   (KR) .......................... 10-2020-0133002

(51) Int. Cl.
*H10K 50/115*   (2023.01)
*H10K 50/11*    (2023.01)
(Continued)

(52) U.S. Cl.
CPC .......... *H10K 50/115* (2023.02); *H10K 50/11* (2023.02); *H10K 50/166* (2023.02); *H10K 71/00* (2023.02);
(Continued)

(58) Field of Classification Search
CPC . H01L 51/502; H01L 51/5004; H01L 51/508; H01L 51/0003; H01L 2251/552;
(Continued)

(56) References Cited

U.S. PATENT DOCUMENTS 6,645,645 B1   11/2003   Adachi et al.
7,700,200 B2    4/2010   Vladimir et al.
(Continued)

FOREIGN PATENT DOCUMENTS

CN   107975763 A     5/2018
CN   111463349 A  *  6/2019
(Continued)

OTHER PUBLICATIONS

European Search Report dated Feb. 17, 2021, of the corresponding European Patent Application No. 20201916.2.
(Continued)

*Primary Examiner* — Mohammad A Rahman
(74) *Attorney, Agent, or Firm* — CANTOR COLBURN LLP

(57) ABSTRACT

A quantum dot light-emitting device including first electrode and a second electrode, a quantum dot layer between the first electrode and the second electrode, a first electron transport layer and a second electron transport layer disposed between the quantum dot layer and the second electrode. The second electron transport layer is disposed between the quantum dot layer and the first electron transport layer, wherein each of the first electron transport layer and the second electron transport layer includes an inorganic material. A lowest unoccupied molecular orbital energy level of the second electron transport layer is shallower than a lowest unoccupied molecular orbital energy level of the first electron transport layer, and a lowest unoccupied molecular orbital energy level of the quantum dot layer is shallower than a
(Continued)

lowest unoccupied molecular orbital energy level of the second electron transport layer. An electronic device including the quantum dot light-emitting device.

17 Claims, 2 Drawing Sheets

(51) Int. Cl.
- H10K 50/16 (2023.01)
- H10K 71/00 (2023.01)
- H10K 71/12 (2023.01)
- H10K 101/40 (2023.01)
- H10K 101/30 (2023.01)

(52) U.S. Cl.
CPC ......... H10K 71/12 (2023.02); H10K 2101/30 (2023.02); H10K 2101/40 (2023.02)

(58) Field of Classification Search
CPC ... H01L 51/5076; H01L 51/5072–5084; H01L 51/50–56; H01L 51/0032–0095; H01L 27/32; H01L 2251/50–568; B32B 2457/206

See application file for complete search history.

(56) References Cited

U.S. PATENT DOCUMENTS

| | | | |
|---|---|---|---|
| 10,164,205 B2 | 12/2018 | Kazlas et al. | |
| 10,333,090 B2 | 6/2019 | Zhou et al. | |
| 2005/0274944 A1 | 12/2005 | Jang et al. | |
| 2008/0290797 A1 | 11/2008 | Park et al. | |
| 2009/0039764 A1 | 2/2009 | Cho et al. | |
| 2009/0212688 A1* | 8/2009 | Song | H10K 50/166 313/504 |
| 2010/0108984 A1 | 5/2010 | Cho et al. | |
| 2010/0283046 A1* | 11/2010 | Uchida | B82Y 20/00 257/E51.027 |
| 2011/0278558 A1* | 11/2011 | Hamada | H01L 51/5048 257/E51.024 |
| 2012/0032138 A1 | 2/2012 | Kim et al. | |
| 2013/0277669 A1 | 10/2013 | Krebs et al. | |
| 2014/0014896 A1 | 1/2014 | Chung et al. | |
| 2015/0008390 A1 | 1/2015 | Lewis et al. | |
| 2015/0028305 A1 | 1/2015 | Niu et al. | |
| 2016/0104854 A1* | 4/2016 | Jeon | H10K 50/16 257/40 |
| 2017/0117480 A1* | 4/2017 | Oh | H10K 50/11 |
| 2019/0131557 A1 | 5/2019 | Lee et al. | |
| 2019/0157596 A1 | 5/2019 | Kim et al. | |
| 2019/0198796 A1* | 6/2019 | Kim | H10K 50/15 |
| 2019/0312222 A1 | 10/2019 | Zhou et al. | |
| 2019/0351822 A1* | 11/2019 | Morgan | B60Q 3/64 |
| 2019/0393438 A1* | 12/2019 | Kessler | H10K 50/16 |
| 2020/0194678 A1* | 6/2020 | Lee | H10K 85/636 |
| 2020/0373500 A1* | 11/2020 | Kase | H10K 85/654 |
| 2021/0020858 A1* | 1/2021 | Qin | H10K 50/16 |
| 2021/0313516 A1* | 10/2021 | Okabe | H10K 85/626 |
| 2021/0408413 A1* | 12/2021 | Yokoyama | H01L 51/441 |

FOREIGN PATENT DOCUMENTS

| | | | |
|---|---|---|---|
| CN | 111463349 A | * | 7/2020 |
| EP | 2621599 A1 | | 8/2013 |
| EP | 3486964 A1 | | 5/2019 |
| KR | 1437271 B1 | | 8/2014 |
| KR | 20150121355 A | | 10/2015 |
| KR | 20190046401 A | | 5/2019 |
| KR | 1995371 B1 | | 6/2019 |
| WO | 2012041847 A1 | | 4/2012 |
| WO | 2015036762 A1 | | 3/2015 |

OTHER PUBLICATIONS

Yizhe Sun, et al., "Efficient Quantum Dot Light-emitting Diodes with a . . . ", Nanoscale, vol. 9, No. 26, Jul. 14, 2014, pp. 8893-9248.

Jiun-Haw Lee, et al., High contrast ratio organic light-emitting devices based on CuPC as electron transport material, Synthetic Metals 144 (2004) 279-283.

Rahul Pandeya, et al., Numerical simulations: Toward the design of 18.6% efficient and stable perovskite solar cell using reduced cerium oxide based ETL, Vacuum 159 (2019) 173-181.

* cited by examiner

QUANTUM DOT LIGHT-EMITTING DEVICE AND ELECTRONIC DEVICE

CROSS-REFERENCE TO RELATED APPLICATION

This application claims priority to Korean Patent Applications No. 10-2019-0129887 and 10-2020-0133002 filed in the Korean Intellectual Property Office on Oct. 18, 2019 and Oct. 14, 2020, respectively, and all the benefits accruing therefrom under 35 U.S.C. § 119, the entire contents of which are incorporated herein by reference.

BACKGROUND

1. Field

A quantum dot light-emitting device and an electronic device that includes the quantum dot light-emitting device are disclosed.

2. Description of the Related Art

Physical characteristics (e.g., energy bandgaps, melting points, etc.) of nanoparticles as well as other intrinsic characteristics may be controlled by changing the particle size of the nanoparticles. For example, semiconductor nanocrystal particles also known as quantum dots that are exposed to photoenergy or an electrical current may emit light in a wavelength corresponding to the particle size of the quantum dots. For a given compositional material the wavelength of emitted light depends upon particle size, and quantum dots of relatively smaller particle size emit light of a shorter wavelength. Accordingly, quantum dots may provide light in a desirable wavelength region by adjusting the particle size.

SUMMARY

A quantum dot light-emitting device includes quantum dots as a light emitting element, and a method of improving performance of the quantum dot light-emitting device is of great interest and is described herein.

An embodiment is to provide a quantum dot light-emitting device capable of realizing improved light-emitting operational performance, e.g., at least one of greater external quantum efficiency, a lower driving voltage for a given luminance value, or improved life-span.

An embodiment is to provide an electronic device including the quantum dot light-emitting device.

According to an embodiment, a quantum dot light-emitting device includes a first electrode and a second electrode, a quantum dot layer between the first electrode and the second electrode, a first electron transport layer and a second electron transport layer disposed between the quantum dot layer and the second electrode, the second electron transport layer is disposed between the quantum dot layer and the first electron transport layer, each of the first electron transport layer and the second electron transport layer includes an inorganic material, a lowest unoccupied molecular orbital energy level of the second electron transport layer is shallower than a lowest unoccupied molecular orbital energy level of the first electron transport layer, and a lowest unoccupied molecular orbital energy level of the quantum dot layer is shallower than a lowest unoccupied molecular orbital energy level of the second electron transport layer.

A difference between the lowest unoccupied molecular orbital energy level of the first electron transport layer and the lowest unoccupied molecular orbital energy level of the second electron transport layer may be about 0.01 eV to about 1.20 eV and a difference between the lowest unoccupied molecular orbital energy level of the second electron transport layer and the lowest unoccupied molecular orbital energy level of the quantum dot layer may be about 0.01 eV to about 1.20 eV.

The difference between the lowest unoccupied molecular orbital energy level of the first electron transport layer and the lowest unoccupied molecular orbital energy level of the second electron transport layer may be about 0.01 eV to about 0.80 eV, and the difference between the lowest unoccupied molecular orbital energy level of the second electron transport layer and the lowest unoccupied molecular orbital energy level of the quantum dot layer is about 0.90 eV to about 1.20 eV.

The lowest unoccupied molecular orbital energy level of the first electron transport layer may range from about 3.2 eV to about 4.8 eV, the lowest unoccupied molecular orbital energy level of the second electron transport layer may range from about 2.8 eV to about 4.2 eV, and the lowest unoccupied molecular orbital energy level of the quantum dot layer may range from about 2.5 eV to about 3.6 eV. Again, the above ranges of energy levels take into account that the lowest unoccupied molecular orbital energy level of the second electron transport layer is shallower than a lowest unoccupied molecular orbital energy level of the first electron transport layer, and a lowest unoccupied molecular orbital energy level of the quantum dot layer is shallower than a lowest unoccupied molecular orbital energy level of the second electron transport layer.

The first electron transport layer may include a first metal oxide nanoparticle and the second electron transport layer may include a second metal oxide nanoparticle different from the first metal oxide nanoparticle.

Each of the first metal oxide nanoparticle and the second metal oxide nanoparticle may have an average particle diameter of less than or equal to about 10 nm.

The inorganic material of the second electron transport layer may include cerium oxide, strontium titanium oxide, niobium oxide, barium tin oxide, or a combination thereof.

For example, the second electron transport layer may include a cerium oxide nanoparticle, a strontium titanium oxide nanoparticle, a niobium oxide nanoparticle, a barium tin oxide nanoparticle, or a combination thereof.

The second electron transport layer may further include an n-type dopant.

The n-type dopant may include an alkali metal, Sn, Ni, Co, Mo, V, Ga, Mn, Fe, Nb, Sr, Ba, In, Ca, Zr, W, Ti, Y, Al, or a combination thereof. Moreover, the n-type dopant may be included as a form of a metal element, a metal compound, a metal salt, or a combination thereof.

The second electron transport layer may include cerium oxide and cesium in an amount of 2 atomic percent to 16 atomic percent based on a total number of atoms of cerium and cesium in the second electron transport layer.

The n-type dopant may include Cs, Rb, Li, Na, K, or a metal salt derived from cesium carbonate $Cs_2CO_3$, cesium phosphate $Cs_3PO_4$, cesium vanadate $Cs_3VO_4$, cesium azide $CsN_3$, lithium nitride $Li_3N$, or rubidium carbonate $Rb_2CO_3$.

The second electron transport layer may include the cerium oxide and the cesium salt, and the cesium may be included in an amount of about 0.01 at % to about 40 at % based on a total number of atoms of cerium and cesium in the second electron transport layer.

The n-type dopant may be included in an amount of about 5 volume % to 40 volume % based on the second electron transport layer.

The first electron transport layer may include a first metal oxide nanoparticle including at least one selected from Zn, Mg, Co, Ni, Ga, Al, Ca, Zr, W, Li, Ti, Ta, Sn, Hf, and Ba.

The first electron transport layer may include a zinc oxide nanoparticle represented by $Zn_{1-x}Q_xO$, wherein Q is a metal except Zn and 0≤x<0.5.

Q may include Mg, Co, Ni, Ga, Al, Ca, Zr, W, Li, Ti, Ta, Sn, Hf, Si, Ba, or a combination thereof.

The first electron transport layer may include a zinc oxide nanoparticle represented by $Zn_{1-x}Q_xO$, wherein Q is Mg, Co, Ni, Ga, Al, Ca, Zr, W, Li, Ti, Ta, Sn, Hf, Si, Ba, or a combination thereof, and 0≤x<0.5, the second electron transport layer may include a cerium oxide nanoparticle, and the zinc oxide nanoparticle and the cerium oxide nanoparticle may have an each average a particle diameter of less than or equal to about 10 nm.

The second electron transport layer may further include cesium, cesium salt, cesium carbonate, or a combination thereof.

The second electron transport layer may have a thickness that is less than a thickness of the first electron transport layer.

In an aspect, the quantum dot layer includes cadmium-free quantum dots, and the quantum dot layer emits light with a peak emission wavelength region of about 430 nm to about 480 nm. According to another embodiment, an electronic device including the quantum dot light-emitting device is provided.

DETAILED DESCRIPTION

Figure 1:
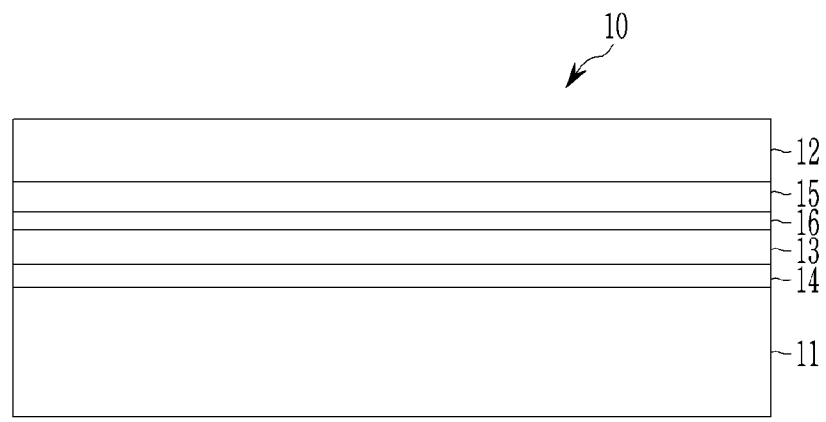
FIG. 1 is a schematic cross-sectional view of a quantum dot light-emitting device according to an embodiment.

The invention now will be described more fully hereinafter with reference to the accompanying drawings, in which various embodiments are shown. This disclosure may, however, be embodied in many different forms and is not construed as limited to the example embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The term, 'combination' as used herein includes a mixture of components or two or more stacking structures.

The term, 'metal' as used herein includes a metal and a semimetal.

A work function, a highest occupied molecular orbital (HOMO) energy level, and a lowest occupied molecular orbital (LUMO) energy level are expressed as an absolute value from a vacuum level. In addition, when the work function, HOMO energy level, and LUMO energy level are referred to be "deep," "high" or "large," the work function, HOMO energy level, and LUMO energy level have a large absolute value based on "0 eV" of the vacuum level, while when the work function, HOMO energy level and LUMO energy level are referred to be "shallow," "low," or "small,"

the work function, HOMO energy level, and LUMO energy level have a small absolute value based on "0 eV" of the vacuum level.

The HOMO energy level is obtained by measuring a photoelectric work function of thin films with a thickness of about 20 nm to about 30 nm using the AC-3 equipment (Riken Keiki Co. Ltd.) and by calculating the emission energy due to the photoelectron effect for the irradiated energy by the following formula in the range of about 7.0 eV to about 4 eV.

$$E = h \cdot c / \lambda$$

(h is Planck's constant, c: speed of light, and λ: wavelength)

The LUMO energy level may be measured by ultraviolet photoelectron spectroscopy (UPS).

A quantum dot light-emitting device according to an embodiment is described with reference to the following drawings.

Figure 2:
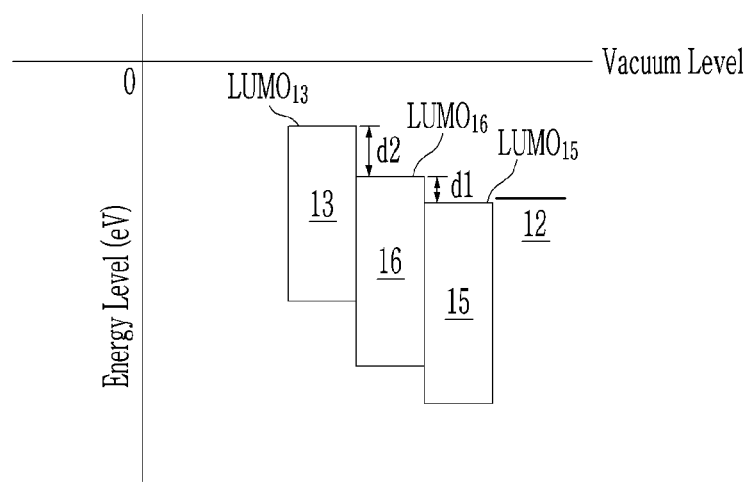
FIG. 2 shows a schematic energy level diagram representing the corresponding energy levels of the quantum dot layer and first and second electron transport layers of the quantum dot light-emitting device of FIG. 1.

FIG. 1 is a schematic cross-sectional view of a quantum dot light-emitting device according to an embodiment and FIG. 2 is a schematic representation of the energy levels of the quantum dot layer and first and second electron transport layers of the quantum dot light-emitting device of FIG. 1.

Referring to FIG. 1, the quantum dot light-emitting device 10 according to an embodiment includes a first electrode 11 and a second electrode 12 each electrode having a surface opposite the other; a quantum dot layer 13 between the first electrode 11 and the second electrode 12; a hole transport layer 14 between the first electrode 11 and the quantum dot layer 13; a first electron transport layer 15 and a second electron transport layer 16 disposed between the second electrode 12 and the quantum dot layer 13 with the second electron transport layer disposed between the quantum dot layer 13 and the first electron transport layer 15 as shown.

A substrate (not shown) may be disposed at the side of the first electrode 11 or the second electrode 12. The substrate may be for example made of an inorganic material such as glass; an organic material such as polycarbonate, polymethyl methacrylate, polyethylene terephthalate, polyethylene naphthalate, polyamide, polyether sulfone, or a combination thereof; or a silicon wafer. The substrate may be omitted.

One of the first electrode 11 and the second electrode 12 is an anode and the other is a cathode. For example, the first electrode 11 may be an anode and the second electrode 12 may be a cathode.

The first electrode 11 may be made of a conductor having high work function, and may be for example made of a metal, a conductive metal oxide, or a combination thereof. The first electrode 11 may be for example made of a metal or an alloy thereof such as nickel, platinum, vanadium, chromium, copper, zinc, or gold; a conductive metal oxide such as zinc oxide, indium oxide, tin oxide, indium tin oxide (ITO), indium zinc oxide (IZO), or fluorine doped tin oxide; or a combination of metal and oxide such as ZnO and Al or $SnO_2$ and Sb, but is not limited thereto.

The second electrode 12 may be for example made of a conductor having a lower work function than the first electrode 11, and may be for example made of a metal, a conductive metal oxide, and/or a conductive polymer. The second electrode 12 may include for example a metal or an alloy thereof such as aluminum, magnesium, calcium, sodium, potassium, titanium, indium, yttrium, lithium, gadolinium, silver, tin, lead, cesium, barium, and the like; a multi-layer structure material such as LiF/Al, $LiO_2$/Al, Liq/Al, LiF/Ca, and $BaF_2$/Ca, but is not limited thereto.

A work function of the first electrode 11 may be higher than that of the second electrode 12. For example, the work function of the first electrode 11 may be for example about 4.5 eV to about 5.0 eV and the work function of the second electrode 12 may be for example about 4.0 eV to about 4.7 eV. Within the ranges, the work function of the first electrode 11 may be for example about 4.6 eV to about 4.9 eV and the work function of the second electrode 12 may be for example about 4.0 eV to about 4.5 eV.

At least one of the first electrode 11 and the second electrode 12 may be a light-transmitting electrode and the light-transmitting electrode may be for example made of a conductive oxide such as zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 12 is a non-light-transmitting electrode, the non-light-transmitting electrode may be made of for example an opaque conductor such as aluminum (Al), silver (Ag), or gold (Au).

The quantum dot layer 13 includes a plurality of quantum dots. The quantum dots may be a semiconductor nanocrystal, and may have various shapes, for example an isotropic semiconductor nanocrystal, a quantum rod, and a quantum plate. Herein, the quantum rod may indicate a quantum dot having an aspect ratio of greater than about 1:1, for example an aspect ratio of greater than or equal to about 2:1, greater than or equal to about 3:1, or greater than or equal to about 5:1. For example, the quantum rod may have an aspect ratio of less than or equal to about 50:1, of less than or equal to about 30:1, or of less than or equal to about 20:1.

The quantum dots may have an average particle diameter (a size of the largest portion for a non-spherical shape) of for example about 1 nm to about 100 nm, about 1 nm to about 80 nm, about 1 nm to about 50 nm, or about 1 nm to about 20 nm.

An energy bandgap of the quantum dot may be adjusted according to the particle size and a composition of the quantum dot, and thus, the photoluminescence wavelength of the quantum dot may be controlled. For example, as the particle size of the quantum dot increases, the quantum dots may have a more narrow energy bandgap and thus emit light in a relatively long wavelength region. Whereas if the particle size of the quantum dot decreases, the quantum dots may have a wider energy bandgap, and thus, emit light in a relatively short wavelength region.

For example, the quantum dot may emit light, for example, in a predetermined wavelength region of a visible region according to its particle size and/or chemical composition. For example, the quantum dot may emit blue light, red light, amber light, or green light. The blue light may have for example a peak emission wavelength in a range of about 430 nanometers (nm) to about 480 nm, the red light may have for example a peak emission wavelength in a range of about 600 nm to about 650 nm, the amber light may have for example a peak emission wavelength in a range of about 570 nm to about 590 nm and the green light may have for example a peak emission wavelength in about 520 nm to about 560 nm.

For example, an average particle size of the blue light emitting quantum dot may be, for example, less than or equal to about 4.5 nm, less than or equal to about 4.3 nm, less than or equal to about 4.2 nm, less than or equal to about 4.1 nm, or less than or equal to about 4.0 nm. Within the ranges, it may be for example about 2.0 nm to about 4.5 nm, about 2.0 nm to about 4.3 nm, about 2.0 nm to about 4.2 nm, about 2.0 about nm to about 4.1 nm, or about 2.0 nm to about 4.0 nm.

The quantum dot may have, for example, a quantum yield of greater than or equal to about 10%, greater than or equal to about 20%, greater than or equal to about 30%, greater than or equal to about 50%, greater than or equal to about 60%, greater than or equal to about 70%, or greater than or equal to about 90%.

The quantum dot may have a relatively narrow full width at half maximum (FWHM). Herein, the FWHM is a width of a wavelength corresponding to a half of a peak absorption point and as the FWHM is narrower, light in a narrower wavelength region may be emitted and high color purity may be obtained. The quantum dot may have, for example, a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm.

For example, the quantum dot may be for example a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. The Group II-VI semiconductor compound may be for example a binary element compound of CdSe, CdTe, ZnS, ZnSe, ZnTe, ZnO, HgS, HgSe, HgTe, MgSe, MgS, or a combination thereof; a ternary element compound of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and a quaternary element compound of HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, but is not limited thereto. The Group III-V semiconductor compound may be for example a binary element compound of GaN, GaP, GaAs, GaSb, AlN, AlP, AlAs, AlSb, InN, InP, InAs, InSb or a combination thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; and a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, but is not limited thereto. The Group IV-VI semiconductor compound may be for example a binary element compound of SnS, SnSe, SnTe, PbS, PbSe, PbTe, or a combination thereof; a ternary element compound of SnSeS, SnSeTe, SnSTe, PbSeS, PbSeTe, PbSTe, SnPbS, SnPbSe, SnPbTe, or a combination thereof; and a quaternary element compound of SnPbSSe, SnPbSeTe, SnPbSTe, or a combination thereof, but is not limited thereto. The Group IV semiconductor compound may be for example a singular element semiconductor compound of Si, Ge, or a combination thereof; and a binary element semiconductor compound of SiC, SiGe, or a combination thereof, but is not limited thereto. The Group I-III-VI semiconductor compound may be for example $CuInSe_2$, $CuInS_2$, CuInGaSe, CuInGaS, or a combination thereof, but is not limited thereto. The Group I-II-IV-VI semiconductor compound may be for example CuZnSnSe, CuZnSnS, or a combination thereof, but is not limited thereto. The Group II-III-V semiconductor compound may include for example InZnP, but is not limited thereto.

The quantum dot may include the binary semiconductor compound, the ternary semiconductor compound, or the quaternary semiconductor compound in a substantially uniform concentration or partially different concentration distributions.

For example, the quantum dot may include a Cd-free quantum dot. Cadmium (Cd) may cause severe environment/health problems and is a restricted element by Restriction of Hazardous Substances Directive (RoHS) in a plurality of countries, and thus the non-cadmium-based quantum dot may be effectively used.

For example, the quantum dot may be a semiconductor compound including zinc (Zn) and at least one of tellurium (Te) and selenium (Se). For example, the quantum dot may be a Zn—Te semiconductor compound, a Zn—Se semiconductor compound, and/or a Zn—Te—Se semiconductor compound. For example, in the Zn—Te—Se semiconductor compound, an amount of tellurium (Te) may be smaller than that of selenium (Se). The semiconductor compound may have a peak emission wavelength in a wavelength region of less than or equal to about 480 nm, for example in a wavelength region of about 430 nm to about 480 nm and may emit blue light.

For example, the quantum dot may be for example a semiconductor compound including indium (In) and at least one of zinc (Zn) and phosphorus (P). For example, the quantum dot may be an In—P semiconductor compound and/or an In—Zn—P semiconductor compound. For example, in the In—Zn—P semiconductor compound, a mole ratio of zinc (Zn) relative to indium (In) may be greater than or equal to about 25:1. The semiconductor compound may have a peak emission wavelength in a wavelength region of less than or equal to about 480 nm, for example in a wavelength region of about 430 nm to about 480 nm and may emit blue light.

The quantum dot may have a core-shell structure. For example, the core and the shell of the quantum dot may have an interface, and an element of at least one of the core or the shell in the interface may have a concentration gradient wherein the concentration of the element(s) of the shell decreases toward the core. For example, a material composition of the shell of the quantum dot has a higher energy bandgap than a material composition of the core of the quantum dot, and thereby the quantum dot may exhibit a quantum confinement effect.

The quantum dot may have one quantum dot core and a multi-layered quantum dot shell surrounding the core. Herein, the multi-layered shell has at least two shells wherein each shell may be a single composition, an alloy, and/or the one having a concentration gradient For example, a shell of a multi-layered shell that is further from the core may have a higher energy bandgap than a shell that is closer to the core, and thereby the quantum dot may exhibit a quantum confinement effect.

For example, the quantum dot having a core-shell structure may for example include a core including a first semiconductor compound including zinc (Zn) and at least one of tellurium (Te) or selenium (Se) and a shell disposed on at least part of a surface of the core and including a second semiconductor compound having a different composition from that of the core.

For example, the first semiconductor compound may be a Zn—Te—Se-based semiconductor compound including zinc (Zn), tellurium (Te), and selenium (Se), for example, a Zn—Se-based semiconductor compound including a relatively small amount of tellurium (Te), for example, a semiconductor compound represented by $ZnTe_xSe_{1-x}$ (wherein, x is greater than about 0 and less than or equal to about 0.05).

For example, in the Zn—Te—Se-based first semiconductor compound, the mole amount of zinc (Zn) may be larger than that of selenium (Se), and the mole amount of selenium (Se) may be larger than that of tellurium (Te). For example, in the first semiconductor compound, a mole ratio of tellurium (Te) relative to selenium (Se) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1. For example, in the first semiconductor compound, a mole ratio of tellurium (Te) relative to zinc (Zn) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.010:1.

The second semiconductor compound may include for example a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor compound, the Group I-III-VI semiconductor compound, the Group I-II-IV-VI semiconductor compound, and the Group II-III-V semiconductor compound are the same as described above.

For example, the second semiconductor compound may include zinc (Zn) and at least one of selenium (Se), or sulfur (S). For example, the shell may include ZnSeS, ZnS, ZnSe, or a combination thereof. For example, the shell may include at least one internal shell disposed near to the core and an outermost shell disposed at the outermost shell of the quantum dot and the internal shell may include ZnSeS and the outermost shell may include ZnS. For example, the shell may have a concentration gradient of one component and for example an amount of sulfur (S) may increase as being apart from the core.

For example, the quantum dot having a core-shell structure may include for example a core including a third semiconductor compound including indium (In) and at least one of zinc (Zn) and phosphorus (P) and a shell disposed on at least one part of the core and including a fourth semiconductor compound having a different composition from the core.

In the In—Zn—P-based third semiconductor compound, a mole ratio of zinc (Zn) relative to indium (In) may be greater than or equal to about 25:1. For example, in the In—Zn—P-based third semiconductor compound, the mole ratio of zinc (Zn) relative to indium (In) may be greater than or equal to about 28:1, greater than or equal to about 29:1, or greater than or equal to about 30:1. For example, in the In—Zn—P-based third semiconductor compound, the mole ratio of zinc (Zn) relative to indium (In) may be less than or equal to about 55:1, for example less than or equal to about 50:1, less than or equal to about 45:1, less than or equal to about 40:1, less than or equal to about 35:1, less than or equal to about 34:1, less than or equal to about 33:1, or less than or equal to about 32:1.

The fourth semiconductor compound may include for example a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor compound, the Group I-III-VI semiconductor compound, the Group I-II-IV-VI semiconductor compound, and the Group II-III-V semiconductor compound are the same as described above.

For example, the fourth semiconductor compound may include zinc (Zn) and sulfur (S), and optionally selenium (Se). For example, the shell may include ZnSeS, ZnS, or a combination thereof. For example, the shell may include at least one internal shell disposed near to the core and an outermost shell disposed at the outermost shell of the quantum dot and at least one of the internal shell and the outermost shell may include the fourth semiconductor compound of ZnS or ZnSeS.

The quantum dot layer 13 may have for example a thickness of about 5 nm to about 200 nm, for example about 10 nm to about 150 nm, about 10 nm to about 100 nm, or about 10 nm to about 50 nm.

The quantum dot layer 13 may have a relatively deep HOMO energy level and may have for example a HOMO energy level of greater than or equal to about 5.4 eV, greater than or equal to about 5.6 eV, greater than or equal to about 5.7 eV, greater than or equal to about 5.8 eV, greater than or equal to about 5.9 eV or greater than or equal to about 6.0 eV. The HOMO energy level of the quantum dot layer 13 may be for example about 5.4 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV, within the ranges, for example about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, or about 5.6 eV to about 6.1 eV, for example about 5.7 eV to about 7.0 eV, about 5.7 eV to about 6.8 eV, about 5.7 eV to about 6.7 eV, about 5.7 eV to about 6.5 eV, about 5.7 eV to about 6.3 eV, about 5.7 eV to about 6.2 eV, or about 5.7 eV to about 6.1 eV, for example about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, about 5.8 eV to about 6.1 eV, for example about 6.0 eV to about 7.0 eV, about 6.0 eV to about 6.8 eV, about 6.0 eV to about 6.7 eV, about 6.0 eV to about 6.5 eV, about 6.0 eV to about 6.3 eV, or about 6.0 eV to about 6.2 eV.

The quantum dot layer 13 may have a relatively shallow LUMO energy level and may have for example an LUMO energy level of less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The LUMO energy level of the quantum dot layer 13 may be for example about 2.5 eV to about 3.6 eV, about 2.5 eV to about 3.5 eV, about 2.5 eV to about 3.4 eV, about 2.5 eV to about 3.3 eV, about 2.5 eV to 3.2 eV, about 2.5 eV to about 3.1 eV, about 2.5 eV to about 3.0 eV, about 2.8 eV to about 3.6 eV, about 2.8 eV to about 3.5 eV, about 2.8 eV to about 3.4 eV, about 2.8 eV to about 3.3 eV, about 2.8 eV to about 3.2 eV, about 3.0 eV to about 3.6 eV, about 3.0 eV to about 3.5 eV, or about 3.0 eV to about 3.4 eV.

The quantum dot layer 13 may have an energy bandgap of about 2.4 eV to about 2.9 eV. Within the ranges, the quantum dot layer 13 may have for example an energy bandgap of about 2.4 eV to about 2.8 eV, for example about 2.4 eV to about 2.78 eV.

The hole transport layer 14 is disposed between the first electrode 11 and the quantum dot layer 13. The hole transport layer 14 may have one layer or two or more layers. In a broad sense, the hole transport layer 14 may include a hole injection layer and/or electron blocking layer in addition to the hole transport layer.

The hole transport layer 14 may have a relatively deep HOMO energy level so that the hole transport layer 14 may match the HOMO energy level of the quantum dot layer 13. Accordingly, mobility of holes from the hole transport layer 14 into the quantum dot layer 13 may be increased.

The HOMO energy level of the hole transport layer 14 may be equal to the HOMO energy level of the quantum dot layer 13 or less than the HOMO energy level of the quantum dot layer 13, e.g., within about 1.0 eV or less. For example, a difference between HOMO energy levels of the hole transport layer 14 and the quantum dot layer 13 may be about 0 eV to about 1.0 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The HOMO energy level of the hole transport layer 14 may be for example greater than or equal to about 5.0 eV, greater than or equal to about 5.2 eV, greater than or equal to about 5.4 eV, greater than or equal to about 5.6 eV, or greater than or equal to about 5.8 eV.

For example, the HOMO energy level of the hole transport layer 14 may be about 5.0 eV to about 7.0 eV, about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

The hole transport layer 14 may include any material satisfying the energy level without a particularly limit and may be for example at least one of poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4''-Tris[phenyl(m-tolyl)amino] triphenylamine), 4,4',4''-tris(N-carbazolyl)-triphenylamine (TCTA), 1,1-bis[(di-4-tolylamino)phenyl]cyclohexane (TAPC), p-type metal oxide (e.g., NiO, $WO_3$, $MoO_3$, etc.), a carbon-based material such as graphene oxide, and a combination thereof, but is not limited thereto.

The first electron transport layer 15 and the second electron transport layer 16 are disposed between the second electrode 12 and the quantum dot layer 13. The first electron transport layer 15 is disposed proximate to the second electrode 12, and the second electron transport layer 16 is disposed proximate to the quantum dot layer 13. That is, the second electron transport layer 16 is disposed between the quantum dot layer 13 and the first electron transport layer 15. Accordingly, the second electrode 12, the first electron transport layer 15, and the second electron transport layer 16, and the quantum dot layer 13 may be sequentially adjacently disposed.

For example, the first electron transport layer 15 may be in contact with the second electrode 12 and the second electron transport layer 16 may be in contact with the quantum dot layer 13.

For example, the first electron transport layer 15 and the second electron transport layer 16 may be in contact with each other.

For example, one surface of the first electron transport layer 15 may be in contact with the second electrode 12, and the other surface of the first electron transport layer 15 may be in contact with the second electron transport layer 16.

For example, one surface of the second electron transport layer 16 may be in contact with the quantum dot layer 13, and the other surface of the second electron transport layer 16 may be in contact with the first electron transport layer 15.

Referring to FIG. 2, the LUMO energy levels of the first electron transport layer 15, the second electron transport layer 16, and the quantum dot layer 13 are sequentially shallower in that order. For example, the LUMO energy level ($LUMO_{16}$) of the second electron transport layer 16 is shallower than the LUMO energy level ($LUMO_{15}$) of the first electron transport layer 15, and the LUMO energy level ($LUMO_{13}$) of the quantum dot layer 13 may be shallower than the LUMO energy level ($LUMO_{16}$) of the second electron transport layer. That is, the LUMO energy level ($LUMO_{15}$) of the first electron transport layer 15, the LUMO energy level ($LUMO_{16}$) of the second electron transport layer 16, and the LUMO energy level ($LUMO_{13}$) of the quantum dot layer 13 may have cascading energy levels that gradually become more shallow in a direction from the first electron transport layer 15 to quantum dot layer 13.

For example, the LUMO energy levels of the first electron transport layer 15, the second electron transport layer 16, and the quantum dot layer 13 may be stepped. Relatively small energy barriers ($d_1$ and $d_2$) may exist between the first electron transport layer 15 and the second electron transport layer 16 and the second electron transport layer 16 and the quantum dot layers 13. The energy barrier ($d_1$) between the first electron transport layer 15 and the second electron transport layer 16 may be a difference between the LUMO energy level ($LUMO_{15}$) of the first electron transport layer 15 and the LUMO energy level ($LUMO_{16}$) of the second electron transport layer 16. The energy barrier ($d_2$) between the second electron transport layer 16 and the quantum dot layer 13 may be a difference between the LUMO energy level ($LUMO_{16}$) of the second electron transport layer 16 and the LUMO energy level ($LUMO_{13}$) of the quantum dot layer 13.

For example, the energy barrier ($d_1$) between the first electron transport layer 15 and the second electron transport layer 16, that is, the difference between the LUMO energy level ($LUMO_{15}$) of the first electron transport layer 15 and the LUMO energy level ($LUMO_{16}$) of the second electron transport layer 16 may be about 0.01 eV to about 1.20 eV, about 0.01 eV to about 1.15 eV, about 0.01 eV to 1.10 eV, about 0.01 eV to about 1.05 eV, about 0.01 eV to about 1.00 eV, about 0.01 eV to about 0.80 eV, about 0.01 eV to about 0.70 eV, about 0.01 eV to about 0.50 eV, about 0.01 eV to about 0.40 eV, about 0.01 eV to about 0.30 eV, or about 0.01 eV to about 0.20 eV.

For example, the energy barrier ($d_2$) between the second electron transport layer 16 and the quantum dot layer 13, that is, the difference between the LUMO energy level ($LUMO_{16}$) of the second electron transport layer 16 and the LUMO energy level ($LUMO_{13}$) of the quantum dot layer 13 may be about 0.01 eV to about 1.20 eV, for example about 0.01 eV to about 1.00 eV, about 0.01 eV to about 0.80 eV, about 0.01 eV to about 0.70 eV, about 0.01 eV to about 0.50 eV, about 0.01 eV to about 0.40 eV, about 0.01 eV to about 0.30 eV, or about 0.01 eV to about 0.20 eV.

For example, the energy barrier ($d_1$) between the first electron transport layer 15 and the second electron transport layer 16, that is, the difference between the LUMO energy level ($LUMO_{15}$) of the first electron transport layer 15 and the LUMO energy level ($LUMO_{16}$) of the second electron transport layer 16 may be smaller than the energy barrier ($d_2$) between the second electron transport layer 16 and the quantum dot layer 13, that is the difference between the LUMO energy level ($LUMO_{16}$) of the second electron transport layer 16 and the LUMO energy level ($LUMO_{13}$) of the quantum dot layer 13.

For example, the energy barrier ($d_1$) between the first electron transport layer 15 and the second electron transport layer 16, that is, the difference between the LUMO energy level ($LUMO_{15}$) of the first electron transport layer 15 and the LUMO energy level ($LUMO_{16}$) of the second electron transport layer 16 may be about 0.01 eV to about 1.00 eV, about 0.01 eV to about 0.80 eV, about 0.01 eV to about 0.70 eV, about 0.01 eV to about 0.50 eV, about 0.01 eV to about 0.40 eV, about 0.01 eV to about 0.30 eV, or about 0.01 eV to about 0.20 eV, and the energy barrier ($d_2$) between the second electron transport layer 16 and the quantum dot layer 13, that is, the difference between the LUMO energy level ($LUMO_{16}$) of the second electron transport layer 16 and the LUMO energy level ($LUMO_{13}$) of the quantum dot layer 13 may be about 0.50 eV to about 1.20 eV may be for example about 0.60 eV to about 1.20 eV, about 0.70 eV to about 1.20 eV, about 0.80 eV to about 1.20 eV, about 0.90 eV to about 1.20 eV, or about 1.00 eV to about 1.20 eV.

For example, the LUMO energy level ($LUMO_{13}$) of the quantum dot layer 13 may be for example less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. Within the range, LUMO energy level ($LUMO_{13}$) of the quantum dot layer 13 may be for example about 2.5 eV to about 3.6 eV, about 2.5 eV to about 3.5 eV, for example about 2.5 eV to about 3.4 eV, for example about 2.5 eV to about 3.3 eV, for example about 2.5 eV to about 3.2 eV, for example about 2.5 eV to about 3.1 eV, for example about 2.5 eV to about 3.0 eV, for example about 2.8 eV to about 3.6 eV, about 2.8 eV to about 3.5 eV, about 2.8 eV to about 3.4 eV, about 2.8 eV to about 3.3 eV, about 2.8 eV to about 3.2 eV, about 3.0 eV to about 3.6 eV, about 3.0 eV to about 3.5 eV, or about 3.0 eV to about 3.4 eV.

For example, the LUMO energy level ($LUMO_{15}$) of the first electron transport layer 15 may be for example less than or equal to about 4.8 eV, less than or equal to about 4.6 eV, about 3.2 eV to about 4.8 eV, about 3.2 eV to about 4.6eV, about 3.2 eV to about 4.5 eV, about 3.2 eV to about 4.3 eV, about 3.2 eV to about 4.1 eV, about 3.4 eV to 4.1 eV, about 3.6 eV to about 4.1 eV, about 3.5 eV to about 4.6 eV, about 3.8 eV to about 4.6 eV, or about 4.1 eV to about 4.6 eV.

For example, the LUMO energy level ($LUMO_{16}$) of the second electron transport layer 16 may be a value between the LUMO energy level ($LUMO_{13}$) of the quantum dot layer 13 and the LUMO energy level ($LUMO_{15}$) of the first electron transport layer 15. For example, the LUMO energy level ($LUMO_{16}$) of the second electron transport layer 16 may be less than or equal to about 4.2 eV, about 2.8 eV to about 4.2 eV, within the range about 2.8 eV to about 4.1 eV, about 3.0 eV to about 4.1 eV, about 3.2 eV to 4.1 eV, about 3.4 eV to about 4.1 eV, about 2.8 eV to about 4.0 eV, about 3.0 eV to about 4.0 eV, about 3.2 eV to 4.0 eV, about 3.4 eV to about 4.0 eV, about 3.5 eV to about 4.2 eV, about 3.5 eV to about 4.1 eV, or about 3.5 eV to about 4.0 eV.

The first electron transport layer 15, the second electron transport layer 16, and the quantum dot layer 13 may satisfy the above-mentioned relationship between the LUMO energy levels, thereby reducing the energy barrier due to a large difference of the LUMO energy levels between the first electron transport layer 15 and the quantum dot layer 13 and facilitating the injection and transport of electrons, and thus the efficiency of the quantum dot light-emitting device may be improved. Unlike blue light emitting cadmium-based quantum dot layers and/or red and green light emitting quantum dot layers, such a structure may be effectively applied to a quantum dot light-emitting device including blue light emitting Cd-free quantum dot layer 13 having a relatively large energy bandgap and shallow LUMO energy levels.

For example, the LUMO energy level of the first electron transport layer 15 may be deeper than a work function or a LUMO energy level of the second electrode 12. For example, the LUMO energy level of the first electron transport layer 15 may be shallower than a work function or a LUMO energy level of the second electrode 12. For example, the LUMO energy level of the first electron transport layer 15 may be substantially equal to a work function or a LUMO energy level of the second electrode 12.

The first electron transport layer 15 may include an inorganic material satisfying the aforementioned energy level. The first electron transport layer 15 may include for example inorganic nanoparticles, for example oxide nanoparticles, and for example metal oxide nanoparticles.

The nanoparticles included in the first electron transport layer 15 may be two-dimensional or three-dimensional particles with an average particle diameter of less than or equal to about 10 nm, less than or equal to about 8 nm, less than or equal to about 7 nm, less than or equal to about 5 nm, less than or equal to about 4 nm, or less than or equal to about 3.5 nm, or within a range of, about 1 nm to about 10 nm, about 1 nm to about 9 nm, about 1 nm to about 8 nm, about 1 nm to about 7 nm, about 1 nm to about 5 nm, about 1 nm to about 4 nm, or about 1 nm to about 3.5 nm.

For example, the first electron transport layer 15 may include a first metal oxide nanoparticle, and the first metal oxide nanoparticle may include at least one of zinc (Zn), magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), and barium (Ba).

For example, the first electron transport layer 15 may include metal oxide nanoparticles including zinc (Zn), and may include metal oxide nanoparticles represented by example $Zn_{1-x}Q_xO$ ($0 \leq x < 0.5$). Herein, Q is a metal element except Zn, for example, magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), silicon (Si), barium (Ba), or a combination thereof.

For example, Q may be magnesium (Mg).

For example, x may be in the range of $0.01 \leq x \leq 0.3$, for example $0.01 \leq x \leq 0.2$ or $0.01 \leq x \leq 0.1$.

The first electron transport layer 15 may have a thickness in a range of about 2 nm to about 80 nm, about 2 nm to about 70 nm, about 2 nm to about 60 nm, about 2 nm to about 50 nm, about 2 nm to about 40 nm, or about 2 nm to about 30 nm.

The second electron transport layer 16 may include an inorganic material satisfying the aforementioned energy level between the quantum dot layer 13 and the first electron transport layer 15. The inorganic material included in the second electron transport layer 16 may be different from the inorganic material included in the first electron transport layer 15.

For example, the second electron transport layer 16 may include an oxide, for example a metal oxide, or a metal oxide semiconductor. However, when the metal oxide or the metal oxide semiconductor included in the first electron transport layer 15 includes zinc, the metal oxide or the metal oxide semiconductor included in the second electron transport layer 16 may not include zinc.

For example, the second electron transport layer 16 may include a cerium-containing oxide (hereinafter referred to as "cerium oxide"), a strontium titanium-containing oxide (hereinafter referred to as "strontium titanium oxide"), a niobium-containing oxide (hereinafter referred to as "niobium oxide"), barium tin-containing oxide (hereinafter referred to as "barium tin oxide"), or a combination thereof.

The cerium oxide may be for example represented by $Ce_{1-z}A_zO$ ($0 \leq z < 0.5$), $Ce_{1-z}A_zO_2$ ($0 \leq z < 0.5$), $Ce_{2-z}A_zO_3$ ($0 \leq z < 1$), and/or $Ce_{3-z}A_zO_4$ ($0 \leq z < 1.5$), wherein A is a metal element except Ce, for example Zn, Mg, Co, Cu, Eu, Gd, Sm, Ni, Al, Mn, Pt, Sn, La, Al, Fe, and/or Y, but is not limited thereto. For example, the cerium oxide may be for example CeO, $CeO_2$, $Ce_2O_3$, $Ce_3O_4$, or a combination thereof. The strontium titanium oxide may be for example $SrTiO_3$, the niobium oxide may be $Nb_2O_5$, and the barium tin oxide may be $BaSnO_3$, but they are not limited thereto.

For example, the second electron transport layer 16 may include inorganic nanoparticles, for example oxide nanoparticles, and for example metal oxide nanoparticles. The metal oxide nanoparticles may be crystalline nanoparticles having high thermal chemical stability, and may be inorganic semiconductors having a relatively wide energy bandgap, for example, about 3.0 eV to about 6.0 eV. However, when the metal oxide nanoparticles included in the first electron transport layer 15 includes zinc, the metal oxide nanoparticles included in the second electron transport layer 16 may not include zinc.

The inorganic nanoparticles included in the second electron transport layer 16 may be two-dimensional or three-dimensional particles with an average particle diameter of less than or equal to about 10 nm, less than or equal to about 8 nm, less than or equal to about 7 nm, less than or equal to about 5 nm, less than or equal to about 4 nm, or less than or equal to about 3.5 nm, or within a range of, about 1 nm to about 10 nm, about 1 nm to about 9 nm, about 1 nm to about 8 nm, about 1 nm to about 7 nm, about 1 nm to about 5 nm, about 1 nm to about 4 nm, or about 1 nm to about 3.5 nm.

For example, the second electron transport layer 16 may include a second metal oxide nanoparticle different from the aforementioned first metal oxide nanoparticle. The second metal oxide nanoparticle may include for example a cerium oxide nanoparticle, a strontium titanium oxide nanoparticle, a niobium oxide nanoparticle, a barium tin oxide nanoparticle, or a combination thereof.

The second electron transport layer 16 may further include an n-type dopant in addition to the aforementioned inorganic material. The n-type dopant included in the second electron transport layer 16 may increase the electron density, further improving electron mobility and provide for a lowering of the turn-on voltage.

The n-type dopant may include a form of a metal element, a metal compound, a metal salt, or a combination thereof, for example a metal compound, or a metal salt including cesium (Cs), rubidium (Rb), lithium (Li), sodium (Na), potassium (K), tin (Sn), nickel (Ni), cobalt (Co), molybdenum (Mo), vanadium (V), gallium (Ga), manganese (Mn), iron (Fe), niobium (Nb), strontium (Sr), barium (Ba), indium (In), calcium (Ca), zirconium (Zr), tungsten O), titanium (Ti), yttrium (Y), aluminum (Al), or a combination thereof, for example cesium (Cs), rubidium (Rb), lithium (Li), sodium (Na), potassium (K), cesium carbonate ($Cs_2CO_3$), cesium phosphate ($Cs_3PO_4$), cesium vanadate ($Cs_3VO_4$), cesium azide ($CsN_3$), lithium nitride ($Li_3N$), rubidium carbonate ($Rb_2CO_3$), or a metal salt derived therefrom, but is not limited thereto.

The n-type dopant may be included in the second electron transport layer in an amount of less than about 50 volume %, or within a range of greater than or equal to about 0.01 volume % and less than about 50 volume %, about 0.01 volume % to about 40 volume %, about 0.1 volume % to about 40 volume %, about 1 volume % to about 40 volume %, about 3 volume % to about 40 volume %, about 5 volume % to about 40 volume %, about 5 volume % to about 35 volume %, about 5 volume % to about 30 volume %, about 5 volume % to about 28 volume %, about 5 volume % to about 25 volume %, about 5 volume % to about 20 volume %, or about 5 volume % to about 15 volume % based on a total volume of the second electron transport layer 16, but is not limited thereto.

The metal atom that is included as the n-type dopant may be included in amount that is less than the primary metal atom (i.e., the metal atom included in the metal oxide nanoparticles) both of which are included in the second electron transport layer 16. For example, the metal atom included as the n-type dopant may be present in an amount of less than about 50 atomic percent (at %), or within a range of, greater than or equal to about 0.01 at % and less than about 50 at %, greater than or equal to about 0.05 at % and less than about 50 at %, about 0.01 at % to about 40 at %, about 0.1 at % to about 40 at %, about 1 at % to about 40 at %, about 2 at % to about 40 at %, about 3 at % to about 40 at %, about 4 at % to about 40 at %, about 2 at % to about 35 at %, about 4 at % to about 35 at %, about 2 at % to about 35 at %, about 2 at % to about 30 at %, about 4 at % to about 30 at %, about 2 at % to about 28 at %, about 4 at % to about 28 at %, about 2 at % to about 25 at %, about 4 at % to about 25 at %, about 2 at % to about 23 at %, about 4 at % to about 23 at %, about 2 at % to about 20 at %, about 4 at % to about 20 at %, about 2 at % to about 18 at %, about 4 at % to about 18 at %, about 2 at % to about 16 at %, or about 4 at % to about 16 at %, based on a total number of metal atoms corresponding to the metal oxide nanoparticle and the n-type dopant in the second electron transport layer 16, but is not limited thereto.

For example, when the second electron transport layer 16 includes cerium oxide as the metal oxide nanoparticle and cesium salt as the n-type dopant, cesium may be included in an amount of less than about 50 at %, or within a range of, greater than or equal to about 0.01 at % and less than about 50 at %, greater than or equal to about 0.1 at % and less than about 50 at %, about 0.01 at % to about 40 at %, about 0.1 at % to about 40 at %, about 1 at % to about 40 at %, about 3 at % to about 40 at %, about 3 at % to about 30 at %, about 3 at % to about 25 at %, about 3 at % to about 20 at %, about 3 at % to about 16 at %, about 5 at % to about 40 at %, about 5 at % to about 35 at %, about 5 at % to about 30 at %, about 5 at % to about 28 at %, about 5 at % to about 25 at %, about 5 at % to about 20 at %, about 5 at % to about 16 at %, based on a total number of atoms of cerium and cesium, but is not limited thereto.

For example, the first electron transport layer 15 and the second electron transport layer 16 may each include metal oxide nanoparticles, and each may include metal oxide nanoparticles having an average particle diameter of less than or equal to about 10 nm, less than or equal to about 7 nm, or less than or equal to about 5 nm. For example, the first electron transport layer 15 may include $Zn_{1-x}Q_xO$ as described above (wherein Q is Mg, Co, Ni, Ga, Al, Ca, Zr, W, Li, Ti, Ta, Sn, Hf, Si, Ba, or a combination thereof and $0 \leq x < 0.5$) and the second electron transport layer 16 may include the aforementioned cerium oxide nanoparticle and optionally further include the n-type dopant described above.

In another embodiment, we describe a layered structure including a quantum dot layer, a first electron transport layer and a second electron transport layer disposed on the quantum dot layer, wherein the second electron transport layer is disposed between the quantum dot layer and the first electron transport layer, and each of the first electron transport layer and the second electron transport layer include an inorganic material, wherein a LUMO energy level of the second electron transport layer is shallower than a LUMO energy level of the first electron transport layer, and a LUMO energy level of the quantum dot layer is shallower than a LUMO energy level of the second electron transport layer.

The layered structure may be disposed between a first electrode and a second electrode.

In addition, the layered structure may designed to have a difference between the LUMO energy level of the first electron transport layer and the LUMO energy level of the second electron transport layer is about 0.01 eV to about 0.50 eV, and a difference between the LUMO energy level of the second electron transport layer and the LUMO energy level of the quantum dot layer is about 0.01 eV to about 1.20 eV. Moreover, the LUMO energy level of the first electron transport layer is about 3.2 eV to about 4.8 eV, the LUMO energy level of the second electron transport layer is about 2.8 eV to about 4.2 eV, and the LUMO energy level of the quantum dot layer is about 2.5 eV to about 3.6 eV.

In one embodiment, the second electron transport layer of the layered structure may include a cerium oxide nanoparticle, a strontium titanium oxide nanoparticle, a niobium oxide nanoparticle, a barium tin oxide nanoparticle, or a combination thereof, and an n-type dopant comprising an alkali metal, Sn, Ni, Co, Mo, V, Ga, Mn, Fe, Nb, Sr, Ba, In, Ca, Zr, W, Ti, Y, Al, or a combination thereof.

In another embodiment, the second electron transport layer of the layered structure may include cerium oxide nanoparticles, and cesium, cesium oxide, or a combination thereof, wherein the cesium is present in an amount of 3 atomic percent to 16 atomic percent based on a total number of atoms of cerium and cesium, and the first electron transport layer comprises zinc oxide nanoparticles.

In one embodiment, the quantum dot layer of the layered structure includes cadmium-free quantum dots, and the quantum dot layer emits light with a peak emission wavelength region of about 430 nm to about 480 nm.

The second electron transport layer 16 may have a thickness of about 2 nm to about 80 nm, or within a range of, about 2 nm to about 70 nm, about 2 nm to about 60 nm, about 2 nm to about 50 nm, about 2 nm to about 40 nm, or about 2 nm to about 30 nm.

For example, the second electron transport layer 16 may have a thickness that is less than the first electron transport layer 15. For example, the thickness of the second electron transport layer 16 may be about 0.1 times to about 0.8 times, about 0.1 times to about 0.7 times, or about 0.1 times to about 0.5 times, the thickness of first electron transport layer 15, but is not limited thereto.

The aforementioned quantum dot layer 13 and the first and second electron transport layers 15 and 16 may be for example formed with a solution process or deposition process and the solution process may be for example spin coating, slit coating, inkjet printing, a nozzle printing, spraying and/or a doctor blade coating, but is not limited thereto.

The quantum dot light-emitting device 10 may display blue, green, or red depending on a light-emitting wavelength spectrum of the quantum dot layer 13, for example the quantum dot light-emitting device 10 may display blue by the quantum dot layer 13 to emit light of blue wavelength spectrum having a peak emission wavelength in about 430 nm to about 480 nm, for example the quantum dot light-emitting device 10 may display green by the quantum dot layer 13 to emit light of green wavelength spectrum having a peak emission wavelength in about 520 nm to about 560 nm, or for example the quantum dot light-emitting device 10 may display red by the quantum dot layer 13 to emit light of red wavelength spectrum having a peak emission wavelength in about 600 nm to about 650 nm.

The quantum dot light-emitting device 10 may have improved electrical and light-emitting characteristics. For examples, external quantum efficiency (EQE) of the quantum dot light-emitting device 10 may be equal to or greater than about 6.0%, equal to or greater than about 7.0%, equal to or greater than about 8.0%, equal to or greater than about 9.0%, or equal to or greater than about 10.0%.

In addition, the quantum dot light-emitting device 10 may have a current density that may be equal to or greater than about 180 A/cm² amperes per square centimeter (A/cm²), equal to or greater than about 190 A/cm², equal to or greater than about 200 A/cm², equal to or greater than about 220 A/cm², equal to or greater than about 240 A/cm², equal to or greater than about 250 A/cm$^2$, equal to or greater than about 270 A/cm$^2$, equal to or greater than about 280 A/cm$^2$, equal to or greater than about 300 A/cm$^2$, equal to or greater than about 310 A/cm$^2$, equal to or greater than about 320 A/cm$^2$, or equal to or greater than about 330 A/cm$^2$.

In addition, the quantum dot light-emitting device 10 may have a driving voltage that may be equal to or less than about 4.2 V, equal to or less than about 4.1 V, equal to or less than about 4.0 V, equal to or less than about 3.9 V, equal to or less than about 3.8 V, equal to or less than about 3.7 V, equal to or less than about 3.6 V, or equal to or less than about 3.5 V, and a current efficiency of the quantum dot light-emitting device 10 may be equal to or greater than about 5.0 Candela per Ampere (max) (Cd/A$_{max}$), equal to or greater than about 5.2 Cd/A$_{max}$, equal to or greater than about 5.4 Cd/A$_{max}$, equal to or greater than about 5.6 Cd/A$_{max}$, equal to or greater than about 5.8 Cd/A$_{max}$, equal to or greater than about 6.0 Cd/A$_{max}$, or equal to or greater than about 6.2 Cd/A$_{max}$, and a luminous efficiency (at 5 milliAmperes) of the quantum dot light-emitting device 10 may be equal to or greater than about 100 Candela per square meter (Cd/m$^2$), equal to or greater than about 120 Cd/m$^2$, equal to or greater than about 140 Cd/m$^2$, equal to or greater than about 150 Cd/m$^2$, equal to or greater than about 160 Cd/m$^2$, equal to or greater than about 170 Cd/m$^2$, equal to or greater than about 180 Cd/m$^2$, equal to or greater than about 190 Cd/m$^2$, equal to or greater than about 200 Cd/m$^2$, or equal to or greater than about 210 Cd/m$^2$.

The quantum dot light-emitting device 10 may be applied to various electronic devices requiring light emission, and may be applied to various electronic devices such as a display device or a lighting device.

Hereinafter, the embodiments are illustrated in more detail with reference to examples. However, these examples are exemplary, and the present scope is not limited thereto.

Synthesis of Quantum Dot Dispersion

Synthesis Example 1

(1) Synthesis of ZnTeSe Core Quantum Dot Dispersion

Selenium (Se) and tellurium (Te) are dispersed in trioctylphosphine (TOP) to obtain a 2 M Se/TOP stock solution and a 0.1 M Te/TOP stock solution.

0.125 millimoles (mmol) of zinc acetate, 0.25 mmol of oleic acid, and 0.25 mmol of hexadecylamine are combined with 10 mL of trioctylamine in a reactor and heated at 120° C. under vacuum. After 1 hour, nitrogen is added to the reactor.

The reactor is then heated at 240° C., the Se/TOP stock solution and the Te/TOP stock solution are rapidly added to the reactor (reaction mixture) in a Te/Se mole ratio of 1/25. After increasing the temperature to 300° C. and maintaining the reaction mixture at 300° C. for 30 minutes, the reaction mixture is rapidly cooled to room temperature, and acetone is added to the reaction mixture. A precipitate is obtained and separated with a centrifuge. The resulting precipitate is dispersed in toluene to obtain ZnTeSe core quantum dot dispersion.

(2) Synthesis of ZnTeSe Core/ZnSeS Shell Quantum Dot Dispersion

Trioctylamine is added to a 10 mL reaction flask, and 0.6 mmol of zinc acetate and 1.2 mmol of oleic acid are added to the flask. The flask is placed under vacuum and the temperature raised to 120° C. for 10 minutes. Nitrogen (N$_2$) is then added to the flask, and the ZnTeSe core quantum dot dispersion obtained in the above step (1) is rapidly injected into the reaction flask. To this reaction mixture is added the dispersions of 2 M Se/TOP and 1M S/TOP so that a Se:S mole ratio of 1.2:2.8 is obtained. The reaction temperature is raised to 340° C. and maintained until the reaction is complete. The reaction flask (reaction product) is cooled down to room temperature, ethanol is added and the prepared nanocrystals are separated with a centrifuge and dispersed in toluene to obtain a ZnTeSe/ZnSeS core/shell quantum dot dispersion.

Synthesis of First Metal Oxide Nanoparticle

Synthesis Example 2

8.07 mmol of zinc acetate dihydrate, 0.93 mmol of magnesium acetate tetrahydrate, and 90 mL of dimethylsulfoxide are added to a reactor and heated under air at 60° C. Subsequently, 15 mmol of tetramethylammonium hydroxide pentahydrate is dissolved in 30 mL of ethanol to prepare a tetramethylammonium hydroxide pentahydrate solution, and then the tetramethylammonium hydroxide pentahydrate solution is slowly added dropwise to the reactor at a rate of 3 mL per minute. After stirring the reaction mixture for 1 hour at 60° C., the prepared $Zn_{0.85}Mg_{0.15}O$ nanoparticles are separated with a centrifuge and dispersed in ethanol to obtain the $Zn_{0.85}Mg_{0.15}O$ nanoparticle dispersion.

The average particle diameter of $Zn_{0.85}Mg_{0.15}O$ nanoparticles measured with UT F30 Tecnai electron microscope is about 3.0 nanometers (nm).

Synthesis of Second Metal Oxide Nanoparticles

Synthesis Example 3

A cerium oxide nanoparticle dispersion in which cerium oxide (CeO$_2$) nanoparticles (796077, Sigma-Aldrich Co., Ltd.) at a concentration of 20 weight percent (wt %) is dispersed in water two or more times, and after each time the nanoparticles are repeatedly separated with a centrifuge to remove an excessive amount of organic materials. The final water-washed cerium oxide nanoparticles are dispersed in ethanol to obtain cerium oxide nanoparticle dispersion (primary) having a concentration of 2 wt %. When measured with TEM, the cerium oxide nanoparticles are shown to have a particle diameter range of 2.3±0.3 nm, and the amount of the organic materials in the cerium oxide nanoparticle dispersion is about 16 wt %.

Additional ethanol is added to the cerium oxide nanoparticle dispersion (primary) to finally obtain the cerium oxide nanoparticle dispersion having a concentration of 0.5 wt %.

Synthesis Example 4

To the primary cerium oxide nanoparticle dispersion having a concentration of 2 wt % that prepared according to Synthesis Example 3, cesium carbonate (Cs$_2$CO$_3$) is added as an ethanol dispersion having a concentration of 2 wt %. The two dispersions are mixed in a volume ratio of 91:9 of CeO$_2$:(Cs$_2$CO$_3$) to obtain cesium-doped cerium oxide (Cs-doped CeO$_2$) nanoparticle dispersion (primary). Additional ethanol is added to the mixed dispersion to about triple the volume of the mixture to obtain a cesium-doped cerium oxide nanoparticle dispersion.

Synthesis Example 5

To the primary cerium oxide nanoparticle dispersion having a concentration of 2 wt % prepared according to Synthesis Example 3, cesium carbonate (Cs$_2$CO$_3$) is added as an ethanol dispersion having a concentration of 2 wt %. The two dispersion are mixed in a volume ratio of 83:17 of $CeO_2$:($Cs_2CO_3$) to obtain cesium-doped cerium oxide (Cs-doped $CeO_2$) nanoparticle dispersion (primary). Additional ethanol is added to the mixed dispersion to about triple the volume of the mixture to obtain a cesium-doped cerium oxide nanoparticle dispersion.

Synthesis Example 6

To the primary cerium oxide nanoparticle dispersion having a concentration of 2 wt % prepared according to Synthesis Example 3, cesium carbonate ($Cs_2CO_3$) is added as an ethanol dispersion having a concentration of 2 wt %. The two dispersion are mixed in a volume ratio of 76:24 of $CeO_2$:($Cs_2CO_3$) to obtain cesium-doped cerium oxide (Cs-doped $CeO_2$) nanoparticle dispersion (primary). Additional ethanol is added to the mixed dispersion to about triple the volume of the mixture to obtain a cesium-doped cerium oxide nanoparticle dispersion.

Synthesis Example 7

To the primary cerium oxide nanoparticle dispersion having a concentration of 2 wt % is prepared according to Synthesis Example 3, and the cesium carbonate ($Cs_2CO_3$) is added as an ethanol dispersion having a concentration of 2 wt %. The two dispersion are mixed in a volume ratio of 68:32 of $CeO_2$:($Cs_2CO_3$) to obtain cesium-doped cerium oxide (Cs-doped $CeO_2$) nanoparticle dispersion (primary). Additional ethanol is added to the mixed dispersion to about triple the volume of the mixture to obtain a cesium-doped cerium oxide nanoparticle dispersion.

Manufacture of Quantum Dot Light-Emitting Devices

Example 1

A glass substrate deposited with ITO (WF: 4.8 eV) is surface-treated with UV-ozone for 15 minutes, and a PEDOT:PSS solution (H.C. Starks) is spin-coated on the treated substrate and heated treated at 150° C. under an air atmosphere for 10 minutes followed by heating at 150° C. under a $N_2$ atmosphere for 30 minutes to form a 25 nm-thick second (or lower) hole transport layer (HOMO: 5.3 eV, LUMO: 2.7 eV). On the lower hole transport layer, a poly[(9,9-dioctyl fluoren-2,7-diyl-co-(4,4'-(N-4-butylphenyl)diphenyl amine] solution (TFB) (Sumitomo) is spin-coated and heat-treated at 150° C. for 30 minutes to form a 25 nm-thick upper hole transport layer (HOMO: 5.6 eV, LUMO: 2.69 eV). Subsequently, on the upper hole transport layer, the ZnTeSe/ZnSeS core/shell quantum dot dispersion (a peak emission wavelength: 453 nm) according to Synthesis Example 1 is spin-coated and heat-treated at 80° C. for 30 minutes to form a 25 nm-thick quantum dot layer (HOMO: 5.7 eV, LUMO: 2.97 eV). On the quantum dot layer, the cerium oxide nanoparticle dispersion (0.5 wt %) according to Synthesis Example 3 is spin-coated and heat-treated at 80° C. for 30 minutes to form a 5 nm-thick second (or lower) electron transport layer (HOMO: 7.80 eV, LUMO: 4.08 eV). On the second electron transport layer, the $Zn_{0.85}Mg_{0.15}O$ nanoparticle dispersion according to Synthesis Example 2 is spin-coated and heat-treated at 80° C. for 30 minutes to form a 15 nm-thick first (or upper) electron transport layer (HOMO: 8.25 eV, LUMO: 4.55 eV). On the first electron transport layer, aluminum (Al) is vacuum-deposited to form a 90 nm thick second electrode (WF: 4.2 eV) and thus manufacture a quantum dot light-emitting device.

Example 2

A quantum dot light-emitting device is manufactured according to the same method as Example 1 except that the cesium-doped cerium oxide nanoparticle dispersion of Synthesis Example 4 is used instead of the cerium oxide nanoparticle dispersion of Synthesis Example 3 to form a 5 nm-thick second electron transport layer (HOMO: 7.78 eV, LUMO: 4.06 eV).

Example 3

A quantum dot light-emitting device is manufactured according to the same method as Example 1 except that the cesium-doped cerium oxide nanoparticle dispersion of Synthesis Example 5 is used instead of the cerium oxide nanoparticle dispersion of Synthesis Example 3 to form a 5 nm-thick second electron transport layer (HOMO: 7.76 eV, LUMO: 4.03 eV).

Example 4

A quantum dot light-emitting device is manufactured according to the same method as Example 1 except that the cesium-doped cerium oxide nanoparticle dispersion of Synthesis Example 6 is used instead of the cerium oxide nanoparticle dispersion of Synthesis Example 3 to form a 5 nm-thick second electron transport layer (HOMO: 7.73 eV, LUMO: 4.01 eV).

Example 5

A quantum dot light-emitting device is manufactured according to the same method as Example 1 except that the cesium-doped cerium oxide nanoparticle dispersion of Synthesis Example 7 is used instead of the cerium oxide nanoparticle dispersion of Synthesis Example 3 to form a 5 nm-thick second electron transport layer (HOMO: 7.72 eV, LUMO: 3.99 eV).

Comparative Example 1

A quantum dot light-emitting device is manufactured according to the same method as Example 1 except that the second electron transport layer is not formed.

Comparative Example 2

A quantum dot light-emitting device is manufactured according to the same method as Example 1 except that the first (or upper) electron transport layer is not formed.

Comparative Example 3

A quantum dot light-emitting device is manufactured according to the same method as Example 1 except that the $Zn_{0.85}Mg_{0.15}O$ nanoparticle dispersion of Synthesis Example 2 is spin-coated on the quantum dot layer and heat-treated at 80° C. for 30 minutes to form a 15 nm-thick second electron transport layer (HOMO: 8.25 eV, LUMO: 4.55 eV), and the cerium oxide nanoparticle dispersion of Synthesis Example 3 is spin-coated on the second electron transport layer and heat-treated at 80° C. for 30 minutes to form a 5 nm-thick first electron transport layer (HOMO: 7.80 eV, LUMO: 4.08 eV).

Evaluation I

Cesium concentrations in the lower electron transport layers of the quantum dot light-emitting devices according to Examples are analyzed by using X-ray photoelectron spectroscopy (XPS, Quantum 2000, Physical Electronics, Inc.) and ultraviolet (UV) photoelectron spectroscopy (UPS, Versaprobe, Physical electronics, Inc.).

Cesium concentrations are expressed by a percentage of a number of atoms of cesium based on a total number of atoms of cerium and cesium in the second electron transport layer.

The results are shown in Table 1.

TABLE 1

|  | Cs concentration (at %) |
| --- | --- |
| Example 1 | 0 |
| Example 2 | 4.75 |
| Example 3 | 8.98 |
| Example 4 | 12.67 |
| Example 5 | 19.02 |

Evaluation II

Current-voltage-luminescence characteristics of the quantum dot light-emitting devices according to Examples and Comparative Examples are evaluated.

The current-voltage-luminescence characteristics are evaluated by using a Keithley 2200 current source and a Minolta CS2000 spectroradiometer.

The results are shown in Table 2 and 3.

TABLE 2

|  | $Lum_{max}$ $(Cd/m^2)$ | $Cd/A_{max}$ | $Cd/m^2$ @ 5 mA | $\lambda_{max}$ (nm) |
| --- | --- | --- | --- | --- |
| Example 1 | 43850 | 5.6 | 211 | 452 |
| Example 2 | 38300 | 5.1 | 169 | 452 |
| Example 3 | 44660 | 6.3 | 187 | 452 |
| Example 4 | 40670 | 5.3 | 166 | 452 |
| Example 5 | 32230 | 5.4 | 215 | 452 |
| Comparative Example 1 | 28320 | 4.8 | 85 | 451 |
| Comparative Example 2 | 1320 | 0.34 | 22 | 452 |
| Comparative Example 3 | 4110 | 1.5 | 42 | 453 |

* $Lum_{max}$: maximum luminance
* $Cd/A_{max}$: maximum current efficiency
* $Cd/m^2$ @ 5 mA: Luminance at 5 mA
* $\lambda_{max}$: peak emission wavelength

TABLE 3

|  | EQE (%) | Current density (@5 V, A/cm²) | V @5 mA | V @1000 nit |
| --- | --- | --- | --- | --- |
| Example 1 | 10.2 | 239 | 3.5 | 3.8 |
| Example 2 | 9.0 | 337.2 | 3.4 | 3.7 |
| Example 3 | 10.9 | 257.4 | 3.3 | 3.5 |
| Example 4 | 9.3 | 328.9 | 3.3 | 3.6 |
| Example 5 | 9.3 | 289.4 | 3.4 | 3.7 |
| Comparative Example 1 | 5.3 | 130.9 | 4.3 | 4.5 |
| Comparative Example 2 | 3.8 | 28.5 | 6.7 | 6.9 |
| Comparative Example 3 | 3.2 | 151.5 | 4.6 | 5.4 |

* EQE: external quantum efficiency at 20,000 nit
* V @5 mA: voltage (turn-on voltage) for driving at 5 mA current
* V @1000 nit: Voltage for 1000 nit light emission Referring to Tables 2 and 3, the quantum dot light-emitting devices according to the Device Examples exhibit a relatively low driving voltage and improved current and luminescence characteristics compared with the quantum dot light-emitting devices according to the Comparative Examples. In particular, Device Example 3 with a second electron transport layer (ETL) having a cesium content of about 9 atomic percent (prepared with Synthetic Example 5) exhibits a significant improvement in external quantum efficiency over that of Device Comparative Examples 1 to 3. The 100% improvement over Device Comparative Example 1 is quite surprising because the device structure of Comparative Example 1 is near identical to that of Device Example 3 except for the presence of the second ETL in the latter. In addition, a person of skill would very much appreciate the lower driving voltages observed in Device Examples 2 to 5 over that of the Comparative Example devices as well as that of Device Example 1, the latter with no cesium in the second ETL.

Evaluation III

Life-span characteristics of the quantum dot light-emitting devices according to Examples and Comparative Examples are evaluated. The life-span characteristics of the quantum dot light-emitting devices are evaluated by determining the time it takes for the luminance to decrease to a selected luminance value relative to an initial luminance value at time $t_0$ while a current for luminance of 650 nit is injected into the quantum dot light-emitting devices. For example, T95 is the time it takes for the device to achieve 95% of the initial luminance, and T50 is the time it takes for the device to achieve 50% of the initial luminance value. Accordingly, the greater the values of T95 and/or T50, the greater the time it takes for the luminance to reach these values, and thus, the greater life-span characteristic of the device. which is measured in hours (hr).

The results are shown in Table 4.

TABLE 4

|  | T95 (hr) | T50 (hr) | Initial voltage $(V_0, V)$ | $V_{1, T50}$ (V) | $\Delta V$ (V) |
| --- | --- | --- | --- | --- | --- |
| Example 1 | 1.15 | 24.4 | 3.8 | 5.1 | 1.3 |
| Example 2 | 3.63 | 26.9 | 3.7 | 5.2 | 1.5 |
| Example 3 | 3.79 | 28.3 | 3.6 | 5.1 | 1.5 |
| Example 4 | 3.42 | 37.9 | 3.6 | 4.9 | 1.3 |
| Example 5 | 1.88 | 17.2 | 3.8 | 4.9 | 1.1 |
| Comparative Example 1 | 0.27 | 9.0 | 4.2 | 6.8 | 2.6 |
| Comparative Example 2 | 0.06 | 2.3 | 4.8 | 5.2 | 0.4 |
| Comparative Example 3 | 0.02 | 0.3 | 4.4 | 4.2 | −0.2 |
| Comparative Example 4 | 0.29 | 7.2 | 4.0 | 4.4 | 0.4 |

* T95 (hr): a time taken for 95% luminance decrease relative to initial luminance
* T50 (hr): a time taken for 50% luminance decrease relative to initial luminance
* Initial voltage ($V_0$, V): voltage when initial luminance is 650 nit
* $V_{1, T50}$: voltage when 50% luminance decrease appears relative to initial luminance
* $\Delta V$ (V): $V_{1, T50} - V_0$ Referring to Table 4, the quantum dot light-emitting devices according to the Device Examples exhibit improved life-span characteristics compared with the quantum dot light-emitting devices according to the Device Comparative Examples. In addition, the technical importance of adding cesium to the second ETL is indicated in the life-span data of Table 4. In particular, Device Examples 2, 3 and 4, with cesium content of about 5.0 at %, 9.0 at %, and 12.7 at %, respectively, exhibits an improvement in life-span relative to Device Example 1 with little or no change in a difference in drive voltage $\Delta V$ at $T_{50}$. Moreover, the technical advantages of adding cesium to the second ETL appears to have an upper limit as indicated by the life-span data for Device Example 5 (cesium, 19 at %).

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot light-emitting device comprising
a first electrode and a second electrode,
a quantum dot layer between the first electrode and the second electrode,
a first electron transport layer and a second electron transport layer disposed between the quantum dot layer and the second electrode, wherein the second electron transport layer is disposed between the quantum dot layer and the first electron transport layer,
wherein a lowest unoccupied molecular orbital energy level of the second electron transport layer is shallower than a lowest unoccupied molecular orbital energy level of the first electron transport layer, and a lowest unoccupied molecular orbital energy level of the quantum dot layer is shallower than a lowest unoccupied molecular orbital energy level of the second electron transport layer,
wherein the first electron transport layer comprises a first metal oxide nanoparticle, and the second electron transport layer comprises a second metal oxide nanoparticle different from the first metal oxide nanoparticle, and the second metal oxide nanoparticle comprises a cerium oxide nanoparticle, a strontium titanium oxide nanoparticle, a barium tin oxide nanoparticle, or a combination thereof,
wherein the second electron transport layer comprises a cerium oxide nanoparticle and an n-type dopant including cesium, wherein the cesium is present in an amount of 2 atomic percent to 16 atomic percent based on a total number of atoms of cerium and cesium in the second electron transport layer.

2. The quantum dot light-emitting device of claim 1, wherein
a difference between the lowest unoccupied molecular orbital energy level of the first electron transport layer and the lowest unoccupied molecular orbital energy level of the second electron transport layer is about 0.01 eV to about 1.20 eV, and
a difference between the lowest unoccupied molecular orbital energy level of the second electron transport layer and the lowest unoccupied molecular orbital energy level of the quantum dot layer is about 0.01 eV to about 1.20 eV.

3. The quantum dot light-emitting device of claim 2, wherein
the difference between the lowest unoccupied molecular orbital energy level of the first electron transport layer and the lowest unoccupied molecular orbital energy level of the second electron transport layer is about 0.01 eV to about 0.80 eV, and
the difference between the lowest unoccupied molecular orbital energy level of the second electron transport layer and the lowest unoccupied molecular orbital energy level of the quantum dot layer is about 0.90 eV to about 1.20 eV.

4. The quantum dot light-emitting device of claim 1, wherein the lowest unoccupied molecular orbital energy level of the first electron transport layer is about 3.2 eV to about 4.8 eV,
the lowest unoccupied molecular orbital energy level of the second electron transport layer is about 2.8 eV to about 4.2 eV, and
the lowest unoccupied molecular orbital energy level of the quantum dot layer is about 2.5 eV to about 3.6 eV.

5. The quantum dot light-emitting device of claim 1, wherein the first metal oxide nanoparticle and the second metal oxide nanoparticle have an average particle diameter of less than or equal to about 10 nanometers.

6. The quantum dot light-emitting device of claim 1, wherein the n-type dopant comprises a metal element, a metal compound or a metal salt including Rb, Li, Na, K, Sn, Ni, Co, Mo, V, Ga, Mn, Fe, Nb, Sr, Ba, In, Ca, Zr, W, Ti, Y, Al, or a combination thereof.

7. The quantum dot light-emitting device of claim 1, wherein the cesium is derived from cesium carbonate, cesium phosphate, cesium vanadate, cesium azide.

8. The quantum dot light-emitting device of claim 1, wherein the n-type dopant is included in an amount of about 5 volume percent to 40 volume percent based on the total volume of the second electron transport layer.

9. The quantum dot light-emitting device of claim 1, wherein the first metal oxide nanoparticle comprises at least one metal of Zn, Mg, Co, Ni, Ga, Al, Ca, Zr, W, Li, Ti, Ta, Sn, Hf, or Ba.

10. The quantum dot light-emitting device of claim 1, wherein the first metal oxide nanoparticle comprises a zinc oxide nanoparticle represented by $Zn_{1-x}Q_xO$, wherein Q is Mg, Co, Ni, Ga, Al, Ca, Zr, W, Li, Ti, Ta, Sn, Hf, Ba, or a combination thereof, and $0 \leq x < 0.5$.

11. The quantum dot light-emitting device of claim 1, wherein
the first metal oxide nanoparticle comprises zinc oxide nanoparticles represented by $Zn_{1-x}Q_xO$, wherein Q is Mg, Co, Ni, Ga, Al, Ca, Zr, W, Li, Ti, Ta, Sn, Hf, Si, Ba, or a combination thereof, and $0 \leq x < 0.5$,
and
the zinc oxide nanoparticles, and the cerium oxide nanoparticles, have an average particle diameter of less than or equal to about 10 nm.

12. The quantum dot light-emitting device of claim 1, wherein the second electron transport layer has a thickness that is less than a thickness of the first electron transport layer.

13. The quantum dot light-emitting device of claim 1, wherein the quantum dot layer comprises cadmium-free quantum dots, and the quantum dot layer emits light with a peak emission wavelength region of about 430 nm to about 480 nm.

14. An electronic device comprising the quantum dot light-emitting device of claim 1.

15. A quantum dot light-emitting device comprising
a first electrode and a second electrode,
a quantum dot layer between the first electrode and the second electrode, the quantum dot layer comprising cadmium-free quantum dots,
a first electron transport layer and a second electron transport layer disposed between the quantum dot layer and the second electrode, wherein the second electron transport layer is disposed between the quantum dot layer and the first electron transport layer, and each of the first electron transport layer and the second electron transport layer comprise an inorganic material, wherein a lowest unoccupied molecular orbital energy level of the second electron transport layer is shallower than a lowest unoccupied molecular orbital energy level of the first electron transport layer, and a lowest unoccupied molecular orbital energy level of the quantum dot layer is shallower than a lowest unoccupied molecular orbital energy level of the second electron transport layer, wherein the second electron transport layer comprises cerium oxide nanoparticles and cesium, the cesium present in an amount of 2 atomic percent to 16 atomic percent based on a total number of atoms of cerium and cesium in the second electron transport layer.

16. The quantum dot light-emitting device of claim 15, wherein the quantum dot layer emits light with a peak emission wavelength region of about 430 nm to about 480 nm, and has an average particle size in a range from about 2.0 nm to about 4.5 nm.

17. A quantum dot light-emitting device comprising
a first electrode and a second electrode,
a quantum dot layer between the first electrode and the second electrode,
a first electron transport layer and a second electron transport layer disposed between the quantum dot layer and the second electrode, wherein the second electron transport layer is disposed between the quantum dot layer and the first electron transport layer, and each of the first electron transport layer and the second electron transport layer comprise an inorganic material, wherein a lowest unoccupied molecular orbital energy level of the second electron transport layer is shallower than a lowest unoccupied molecular orbital energy level of the first electron transport layer, and a lowest unoccupied molecular orbital energy level of the quantum dot layer is shallower than a lowest unoccupied molecular orbital energy level of the second electron transport layer, wherein the second electron transport layer comprises cerium oxide nanoparticles and a cesium, and the cesium is included in an amount of about 0.01 atomic percent to about 40 atomic percent based on a total number of atoms of cerium and cesium in the second electron transport layer.

* * * * *